United States Patent
Torng et al.

(10) Patent No.: US 10,481,815 B2
(45) Date of Patent: *Nov. 19, 2019

(54) MLC BASED MAGNETIC RANDOM ACCESS MEMORY USED IN CNN BASED DIGITAL IC FOR AI

(71) Applicant: GYRFALCON TECHNOLOGY INC., Milpitas, CA (US)

(72) Inventors: Chyu-Jiuh Torng, Dublin, CA (US); Lin Yang, Milpitas, CA (US); Qi Dong, San Jose, CA (US)

(73) Assignee: Gyrfalcon Technology Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/403,678

(22) Filed: May 6, 2019

(65) Prior Publication Data
US 2019/0258417 A1 Aug. 22, 2019

Related U.S. Application Data

(63) Continuation of application No. 15/591,069, filed on May 9, 2017, now Pat. No. 10,331,368, which is a
(Continued)

(51) Int. Cl.
*G06N 3/04* (2006.01)
*G06F 3/06* (2006.01)
(Continued)

(52) U.S. Cl.
CPC ............ *G06F 3/0629* (2013.01); *G06F 3/061* (2013.01); *G06F 3/0679* (2013.01);
(Continued)

(58) Field of Classification Search
CPC ............... G06F 3/0629; G06F 13/4068; G06F 13/1668; G06F 3/0679; G06F 3/061;
(Continued)

(56) References Cited

U.S. PATENT DOCUMENTS 5,355,528 A * 10/1994 Roska .................. G06N 3/0635
706/38
7,884,433 B2   2/2011 Zhong et al.
(Continued)

OTHER PUBLICATIONS

Zhao et al. "Design of MRAM based Logic Circuits and its Applications", Proceeding GLSVLSI '11 Proceedings of the 21st edition of the great lakes symposium on Great lakes symposium on VLSI pp. 431-436 Lausanne, Switzerland—May 2-4, 2011.
(Continued)

*Primary Examiner* — Khamdan N. Alrobaie
(74) *Attorney, Agent, or Firm* — RC Patent Services

(57) ABSTRACT

CNN based digital IC for AI contains a number of CNN processing units. Each CNN processing unit contains CNN logic circuits operatively coupling to a memory subsystem. A first subsystem includes an array of first magnetic random access memory (RAM) cells for storing weights and an array of second magnetic RAM cells for storing input signals. A second subsystem includes an array of first magnetic RAM cells for storing one-time-programming weights and an array of second magnetic RAM cells for storing input signals. A third subsystem includes an array of first magnetic RAM cells for storing weights, an array of second magnetic RAM cells for storing input signals and an array of third magnetic RAM cells for storing one-time-programming unique data pattern for security identification. Either MLC STT-RAM or MLC OST-MRAM containing at least two MTJ elements can be configured as different memories for forming memory subsystem.

12 Claims, 19 Drawing Sheets

Related U.S. Application Data continuation-in-part of application No. 15/498,378, filed on Apr. 26, 2017, which is a continuation-in-part of application No. 15/477,263, filed on Apr. 3, 2017, now Pat. No. 10,331,367.

(51) Int. Cl.

| | |
|---|---|
| *G06F 13/16* | (2006.01) |
| *G06F 13/40* | (2006.01) |
| *G11C 11/56* | (2006.01) |
| *G11C 11/16* | (2006.01) |
| *H01L 43/08* | (2006.01) |
| *H01L 27/22* | (2006.01) |

(52) U.S. Cl.
CPC ...... *G06F 13/1668* (2013.01); *G06F 13/4068* (2013.01); *G06N 3/04* (2013.01); *G11C 11/161* (2013.01); *G11C 11/1673* (2013.01); *G11C 11/1675* (2013.01); *G11C 11/5607* (2013.01); *H01L 27/222* (2013.01); *H01L 43/08* (2013.01); *Y02D 10/14* (2018.01); *Y02D 10/151* (2018.01)

(58) Field of Classification Search
CPC .............. G11C 11/161; G11C 11/1675; G11C 11/5607; G11C 11/1673; H01L 27/222; H01L 43/08; H01L 43/12; H01L 43/02; G06N 3/04
See application file for complete search history.

(56) References Cited

U.S. PATENT DOCUMENTS

| | | | |
|---|---|---|---|
| 8,183,061 B2 | 5/2012 | Zhong et al. | |
| 8,324,698 B2 | 12/2012 | Zhong et al. | |
| 8,772,051 B1 | 7/2014 | Zhong et al. | |
| 8,803,293 B2 | 8/2014 | Zhong et al. | |
| 8,933,542 B2 | 1/2015 | Zhong et al. | |
| 9,111,222 B2* | 8/2015 | Aparin ................ | G06N 3/0472 |
| 9,166,143 B1 | 10/2015 | Gan et al. | |
| 9,437,272 B1 | 9/2016 | Lu et al. | |
| 9,673,388 B2 | 6/2017 | Toh et al. | |
| 9,685,604 B2 | 6/2017 | Huang et al. | |
| 9,734,880 B1* | 8/2017 | Augustine .............. | G06N 3/049 |
| 9,767,557 B1* | 9/2017 | Gulsun ................ | G06T 7/0012 |
| 9,940,534 B1* | 4/2018 | Yang .................... | G06K 9/4628 |
| 9,959,500 B1* | 5/2018 | Torng ....................... | G06N 3/08 |
| 2006/0011958 A1 | 1/2006 | Jeong et al. | |
| 2007/0047294 A1 | 3/2007 | Panchula | |
| 2011/0273926 A1 | 11/2011 | Wu et al. | |
| 2012/0294076 A1 | 11/2012 | Lee et al. | |
| 2012/0294078 A1 | 11/2012 | Kent et al. | |
| 2014/0071741 A1 | 3/2014 | Kim et al. | |
| 2016/0218280 A1 | 7/2016 | Park et al. | |
| 2016/0225818 A1 | 8/2016 | Toh et al. | |
| 2016/0322090 A1 | 11/2016 | Chan et al. | |
| 2017/0039472 A1 | 2/2017 | Kudo | |
| 2017/0040531 A1 | 2/2017 | Chung et al. | |
| 2017/0092693 A1 | 3/2017 | Tan et al. | |
| 2017/0092851 A1 | 3/2017 | Han et al. | |
| 2017/0103298 A1 | 4/2017 | Liang et al. | |
| 2017/0103299 A1 | 4/2017 | Aydonat et al. | |
| 2017/0110653 A1 | 4/2017 | Seo et al. | |
| 2017/0125666 A1 | 5/2017 | Han et al. | |
| 2017/0148979 A1 | 5/2017 | Kim et al. | |
| 2017/0324025 A1 | 11/2017 | Lee et al. | |
| 2018/0137414 A1 | 5/2018 | Du et al. | |

OTHER PUBLICATIONS

Kodzuka et al. "Effects of boron composition on tunneling magnetoresistance ratio and microstructure of CoFeB/MgO/CoFeB pseudo-spin-valve magnetic tunnel junctions", Journal of Applied Physics 111, 043913 (2012).

Sze et al. "Hardware for Machine Learning: Challenges and Opportunities", Published at an invited conference paper at CICC 2017, Submitted on Dec. 22, 2016 (v1).

L. Thomas et al. "Basic Principles, Challenges and Opportunities of STT-MRAM for Embedded Memory Applications" MSST 2017—Santa Clara, May 17, 2017.

Kultursay et al. "Evaluating STT-RAM as an Energy-Efficient Main Memory Alternative", Published in: Performance Analysis of Systems and Software (ISPASS), 2013 IEEE International Symposium, Apr. 21-23, 2013.

Thomas, et al. Perpendicular spin transfer torque magnetic random access memories with high spin torque efficiency and thermal stability for embedded applications:, J. App. Physics 2014:115(17) 172615.

USPTO restriction requirement for U.S. Appl. No. 15/477,263 (parent case) dated Aug. 2, 2018.

USPTO office action for U.S. Appl. No. 15/477,263 (parent case) dated Sep. 7, 2018.

USPTO office action for U.S. Appl. No. 15/591,069 (parent case) dated Sep. 7, 2018.

USPTO office action for U.S. Appl. No. 15/632,203 (related case) dated Sep. 20, 2018.

USPTO office action for U.S. Appl. No. 15/632,203 (related case) dated Feb. 26, 2019.

USPTO notice of allowance for U.S. Appl. No. 15/477,263 (parent case) dated Mar. 11, 2019.

USPTO notice of allowance for U.S. Appl. No. 15/591,069 (parent case) dated Mar. 14, 2019.

USPTO notice of allowance for U.S. Appl. No. 15/632,203 (related case) dated Mar. 25, 2019.

\* cited by examiner

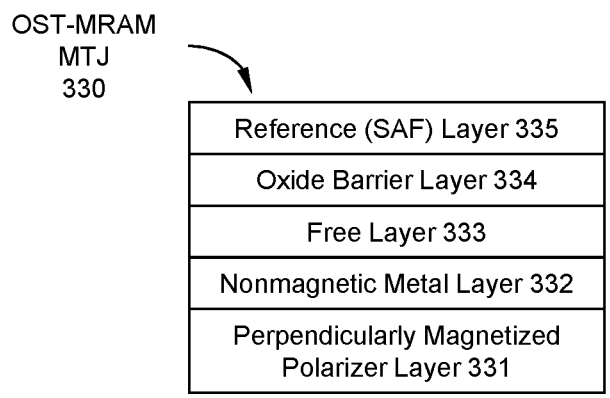
FIG. 3E
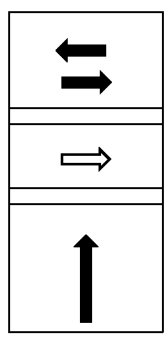 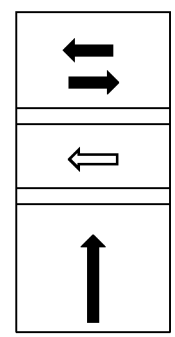
FIG. 3F  FIG. 3G

800

| Target Material | Yield @ 600 ev | Sputtering Rate* (Å/sec) |
|---|---|---|
| Ag | 3.4 | 380 |
| Al | 1.2 | 170 |
| Au | 2.8 | 320 |
| Cr | 1.3 | 180 |
| Ir | 1.2 | 135 |
| Mg | 1.4 | 200 |
| Mo | 0.9 | 120 |
| Nb | 0.6 | 80 |
| Ru | 1.3 | 180 |
| Ta | 0.6 | 85 |
| Ti | 0.6 | 80 |
| TiN |  | 40 |
| W | 0.6 | 80 |
| Zr | 0.7 | 85 |

*FIG. 8*

|                                                          |
|----------------------------------------------------------|
| Soft Domain Reference (SAF) Layer 1015                   |
| Soft Domain Oxide Barrier Layer 1014                     |
| Soft Domain Free Layer 1013                              |
| Soft Domain Nonmagnetic Metal Layer 1012                 |
| Soft Domain Perpendicularly Magnetized Polarizer Layer 1011 |

| High Selectivity Layer 1010 |
|-----------------------------|
| Hard Domain Reference (SAF) Layer 1005 |
| Hard Domain Oxide Barrier Layer 1004 |
| Hard Domain Free Layer 1003 |
| Hard Domain Nonmagnetic Metal Layer 1002 |
| Hard Domain Perpendicularly Magnetized Polarizer Layer 1001 |

MLC BASED MAGNETIC RANDOM ACCESS MEMORY USED IN CNN BASED DIGITAL IC FOR AI

CROSS-REFERENCE TO RELATED APPLICATIONS

This application is a continuation of a co-pending U.S. patent application Ser. No. 15/591,069 filed on May 9, 2017, which is a continuation-in-part (CIP) of U.S. patent application Ser. No. 15/498,378, entitled "Buffer Memory Architecture For A CNN Based Processing Unit And Creation Methods Thereof" filed on Apr. 26, 2017, which is a CIP of U.S. patent application Ser. No. 15/477,263, entitled "Embedded Memory Subsystems For A CNN Based Processing Unit And Methods Of Making" filed on Apr. 3, 2017. All of which are hereby incorporated by reference in their entirety for all purposes.

FIELD

The invention generally relates to the field of integrated circuit and more particularly to multi-level cell (MLC) technology based Magnetic Random Access Memory used in CNN based digital IC for AI.

BACKGROUND

Artificial Intelligence (AI) is defined as intelligence exhibited by machines (e.g., computers, processors, etc.). Intelligence means the ability to acquire and apply knowledge and skills. Many different approaches have been tried and tested in AI research since 1960s. One of the more promising techniques is based on Cellular Neural Networks or Cellular Nonlinear Networks (CNN). CNN have been applied to many different fields and problems including, but limited to, image processing, speech recognition, etc. However, most of the prior art CNN approaches are either based on software solutions (e.g., Convolutional Neural Networks, Recurrent Neural Networks, etc.) or based on hardware that are designed for other purposes (e.g., graphic processing, general computation, etc.). As a result, CNN prior approaches are too slow in term of computational speed and/or too expensive thereby impractical for processing large amount of imagery data. The imagery data can be from any two-dimensional signals (e.g., a still photo, a picture, a frame of a video stream, etc.).

For a CNN based IC for artificial intelligence, data must be provided as close to the CNN processing logic. In addition, different characteristics of data may be required. For example, in image processing, filter coefficients and imagery data have different requirements. Filter coefficients need to be validly stored for long time, while the imagery data are written and read more often.

Prior art approaches have problems and shortfalls. For example, SRAM (Static RAM) was used for storing imagery data. Flash memory was used for storing filter coefficients. However, integrating different memory technologies/types on a single silicon chip is not practical and the power consumption is too high. Furthermore, security of a CNN based IC would be a concern, since increasing numbers of mission critical applications may be based on such an IC.

SUMMARY

This section is for the purpose of summarizing some aspects of the invention and to briefly introduce some preferred embodiments. Simplifications or omissions in this section as well as in the abstract and the title herein may be made to avoid obscuring the purpose of the section. Such simplifications or omissions are not intended to limit the scope of the invention.

For a CNN processing unit for either mobile co-processor or servo co-processor for processing large amount of input signals (e.g., imagery data, voice data, etc.) Processing-in memory or memory-in processor are the most promising approach. Together with low power consumption, read/write speed and highly distributed on the same silicon are the three major requirements.

MLC magnetic random access memory configured for a memory subsystem of a CNN based processing unit and methods of creation are disclosed.

According to one embodiment, a CNN based digital IC for AI contains a number of CNN processing units. Each CNN processing unit comprises CNN logic circuits operatively coupling to a memory subsystem that includes an array of first magnetic random access memory cells for storing weights (e.g., filter coefficients) and an array of second magnetic random access memory cells for storing input signals (e.g., imagery data). Both memories made of either MLC STT-RAM or MLC OST-MRAM can be fabricated on a same silicon.

According to another embodiment, a CNN based digital IC for AI contains a number of CNN processing units. Each CNN processing unit comprises CNN logic circuits operatively coupling to a memory subsystem that includes an array of first magnetic random access memory cells for storing one-time-programming (OTP) weights (e.g., filter coefficients) and an array of second magnetic random access memory cells for storing input signals (e.g., imagery data). Both memories made of either MLC STT-RAM or MLC OST-MRAM can be fabricated on a same silicon. OTP memory can be created during various stages of fabrication or use of the IC.

According to yet another embodiment, a CNN based digital IC for AI contains a number of CNN processing units. Each CNN processing unit comprises CNN logic circuits operatively coupling to a memory subsystem that includes an array of first magnetic random access memory cells for storing weights, an array of second magnetic random access memory cells for storing input signals and an array of third magnetic random access memory cells for storing OTP unique data pattern for security purpose. All three memories made of either MLC STT-RAM or MLC OST-MRAM can be fabricated on a same silicon. OTP memory can be created during various stages of fabrication or use of an IC.

To break down the oxide barrier layers for creating OTP memory, a number of techniques are used: To break down the oxide barrier layer of a MTJ element in SLC technology or respective oxide barrier layers of MTJ elements in MLC technology for creating OTP memory, a number of techniques are used:

(a) applying an electric voltage higher than normal read/write voltage (a range of 100-700 mV (millivolts) in SLC technology and 0.1-1.5 V (volts) in MLC technology) during fabrication or use;
(b) applying an electric current longer than normal read/write time or duty cycle of 5 ns (nanoseconds) during fabrication or use;
(c) setting different size of MTJ elements (bits) in a range of 20-150 nm during fabrication, the smaller size of MTJ element is easier for respective oxide barrier layers to be broken down; and (d) setting different cell size such that different gate length of transistors can be used during fabrication, a larger transistor would provide larger electric current. The preferred gate length of a transistor is between 50 nm to 280 nm for 28 nm semiconductor technology.

Furthermore, the aforementioned techniques are used alone or in any combinations, for example, (a) and (c), (a) and (d), (c) and (d), (b), (c) and (d), and the likes.

Other objects, features, and advantages of the invention will become apparent upon examining the following detailed description of an embodiment thereof, taken in conjunction with the attached drawings.

BRIEF DESCRIPTION OF THE DRAWINGS

These and other features, aspects, and advantages of the invention will be better understood with regard to the following description, appended claims, and accompanying drawings as follows:

FIGS. 3E-3G are diagrams showing various features of an example SLC Orthogonal Spin Transfer Magnetic RAM (OST-MRAM) being used for forming a memory subsystem, according to an embodiment of the invention;

FIG. 8 is a table summarizes properties of example materials that can be used in high selectivity layer during fabrication of the embedded memory subsystem of the CNN based IC for artificial intelligence, according to an embodiment of the invention;

FIGS. 10A-10E are diagrams showing various features of an example MLC OST-RAM being used for forming a memory subsystem, according to an embodiment of the invention.

DETAILED DESCRIPTIONS

In the following description, numerous specific details are set forth in order to provide a thorough understanding of the invention. However, it will become obvious to those skilled in the art that the invention may be practiced without these specific details. The descriptions and representations herein are the common means used by those experienced or skilled in the art to most effectively convey the substance of their work to others skilled in the art. In other instances, well-known methods, procedures, and components have not been described in detail to avoid unnecessarily obscuring aspects of the invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams or circuits representing one or more embodiments of the invention do not inherently indicate any particular order nor imply any limitations in the invention. Used herein, the terms "top", "bottom", "upper", "lower","vertical", "horizontal", "planar", "parallel", "anti-parallel", "perpendicular", "plan", "elevation" are intended to provide relative positions for the purposes of description, and are not intended to designate an absolute frame of reference. Additionally, term "MTJ element" and "MTJ bit" are interchangeable.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Embodiments of the invention are discussed herein with reference to FIGS. 1-10E. However, those skilled in the art will readily appreciate that the detailed description given herein with respect to these figures is for explanatory purposes as the invention extends beyond these limited embodiments.

Figure 1:
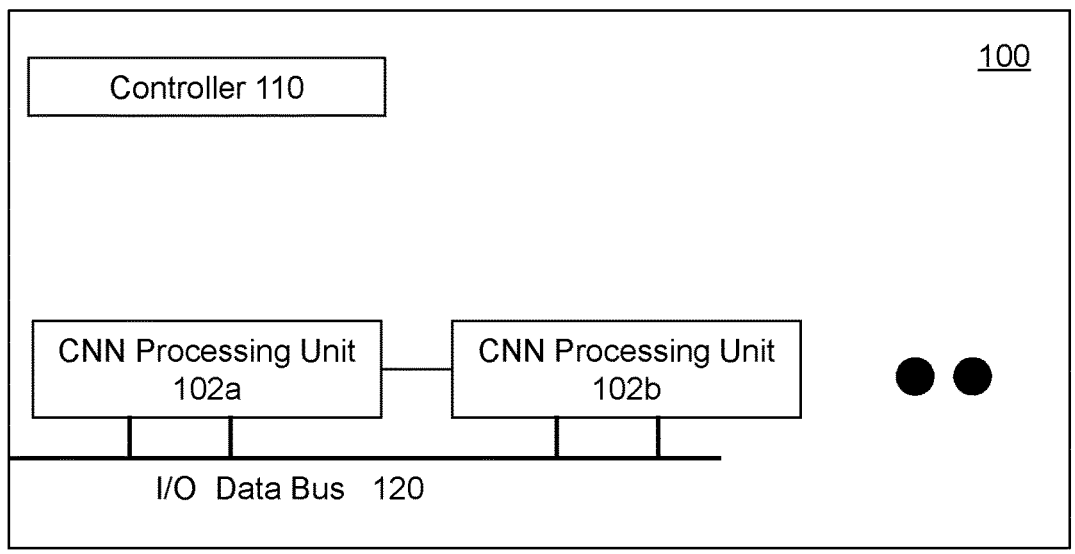
FIG. 1 is a block diagram illustrating an example CNN based IC for artificial intelligence in accordance with one embodiment of the invention.

Referring first to FIG. 1, it is shown a block diagram illustrating an example CNN based digital integrated circuit (IC) for artificial intelligence 100 for artificial intelligence (e.g., image processing, voice reorganization, etc.) in accordance with one embodiment of the invention.

The IC 100 is implemented as a digital semi-conductor chip (e.g., a silicon substrate) and contains a controller 110, and a plurality of CNN processing units 102a-102b operatively coupled to at least one input/output (I/O) data bus 120. Controller 110 is configured to control various operations of the CNN processing units 102a-102b, which are connected in a loop with a clock-skew circuit.

In one embodiment, the digital integrated circuit 100 is extendable and scalable. For example, multiple copy of the digital integrated circuit 100 can be implemented on a single semi-conductor chip.

Figure 2A:
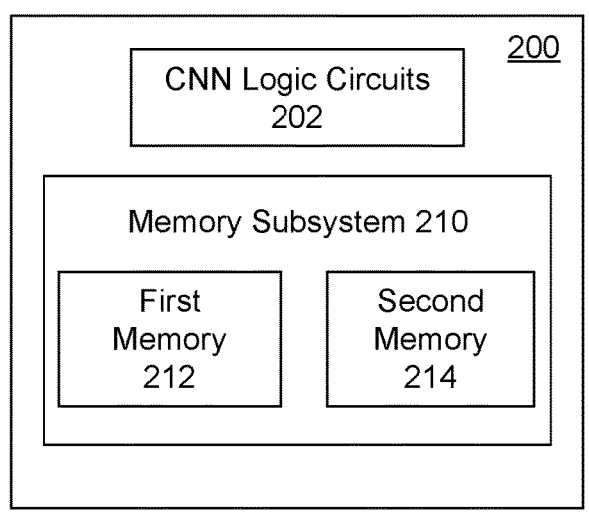
FIG. 2A is a function block diagram showing an example CNN processing unit including a first example memory subsystem according to an embodiment of the invention.

All of the CNN processing units are identical. For illustrating simplicity, function block diagram of an example CNN processing unit 200 is shown in FIG. 2A. The invention sets no limit to the number of CNN processing units on a digital semi-conductor chip.

Each CNN processing unit 200 contains CNN logic circuits 202, which is operatively coupled to an embedded memory subsystem 210. In other words, the memories of the embedded memory subsystem 210 and the CNN logic circuits 202 are located on the same digital semi-conductor chip. In one embodiment, CNN logic circuits 202 are configured for performing convolution operations of input signals with filter coefficients (or weights). In one embodiment, the input signals are imagery data. In another embodiment, the input signals are converted voice data.

Memory subsystem 210 is made of a first memory 212 and a second memory 214. The first memory 212 is configured for requiring data being stored with higher retention rate than the second memory 214. The second memory 214 is configured for higher endurance of balanced data read and write operations than the first memory 212. In one embodiment, the first memory 212 is for storing weights (e.g., filter coefficients) while the second memory 214 is for storing input signals (e.g., imagery data in an image processing application).

The first memory 212 contains a first group of magnetic random access memory cells. The second memory 214 contains a second group of magnetic random access memory cells. Magnetic random access memory comprises either spin transfer torque magnetic random access memory (STT-RAM) or orthogonal spin transfer magnetic memory (OST-MRAM). Each of the magnetic random access memory cells contains one magnetic tunnel junction (MTJ) element in single-level cell (SLC) technology and contains at least two MTJ elements (e.g., upper and lower MTJ elements) in multi-level cell (MLC) technology.

According to one embodiment in SLC technology based STT-RAM, MTJ elements in the first and second groups are made of identical layers except their respective planar areas. Each MTJ element in the first group has a circular planar area, which has a diameter in a range of 40-120 nm (nanometer). Each MTJ element in the second group has a circular planar area, which has a diameter in a range of 30-75 nm. The details are shown in FIGS. 3A-3D and 4A-4B.

According to another embodiment in MLC technology based STT-RAM, lower and upper MTJ elements in the first and second groups have different sizes in terms of planar area at different planes. The details are shown in FIGS. 9A-9F.

The details of an MTJ element in SLC OST-MRAM are shown in FIGS. 3E-3G and FIGS. 10A-10E show details of MTJ elements in MLC OST-MRAM.

Figure 2B:
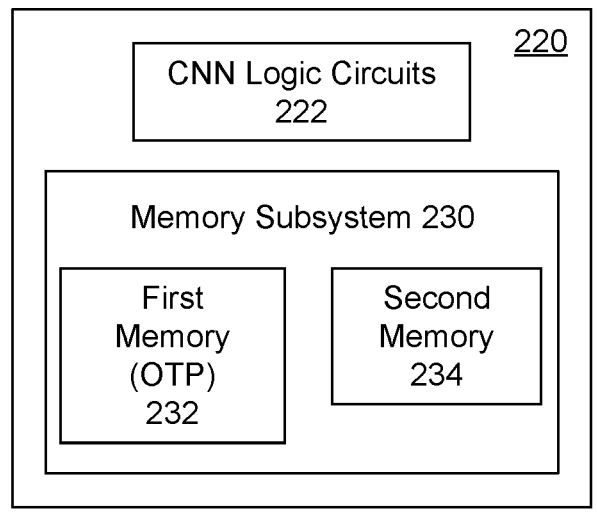
FIG. 2B is a function block diagram showing another example CNN processing unit including a second example memory subsystem according to an embodiment of the invention.

FIG. 2B shows another example CNN processing unit 220, which contains CNN logic circuits 222 operatively coupling to a memory subsystem 230. The memory subsystem 230 includes first memory 232 and second memory 234. The first memory 232 is a one-time-programming (OTP) memory configured for storing filter coefficients or weights that are stored once and never changed. In other words, one specific set of filters are stored in the memory subsystem of respective CNN processing units of a CNN based digital IC for AI, which is designed for performing one specific task (e.g., extracting a particular feature of an image such as traffic signal recognition, lane keeping, etc.). The second memory 234 is configured for storing imagery data, which requires frequent read/write operations. Both the first memory 232 and the second memory 234 are made of either STT-RAM or OST-MRAM cells based on SLC or MLC technology.

Figure 2C:
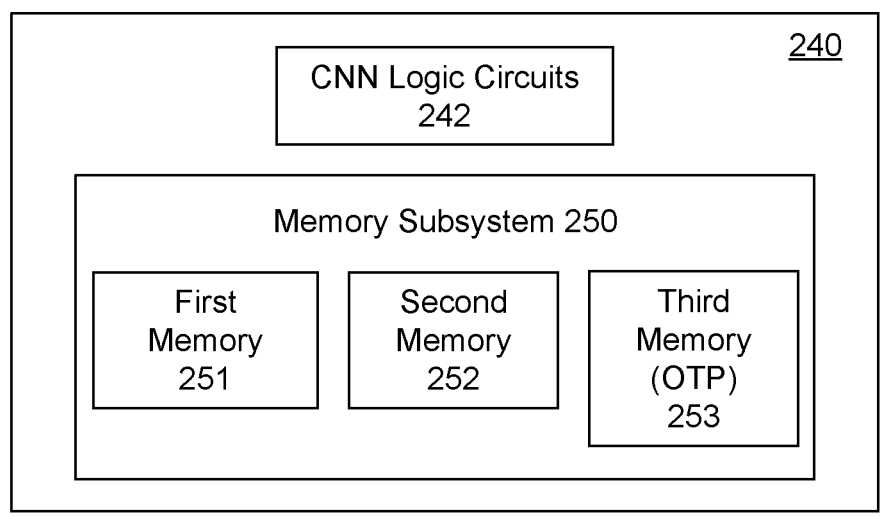
FIG. 2C is a function block diagram showing yet another example CNN processing unit including a third example memory subsystem according to an embodiment of the invention.

In another embodiment shown in FIG. 2C, a CNN processing unit 240 comprises CNN logic circuits 242 operatively coupling to a memory subsystem 250. The memory subsystem 250 contains first memory 251, second memory 252 and third memory 253. The first memory 251 is configured for storing filter coefficients and the second memory 252 is configured for storing imagery data substantially similar to the CNN processing unit 200 of FIG. 2A. The third memory 253 is a one-time-programming (OTP) memory that can be used for other purposes (e.g., a unique pattern for security). In order for all three types of memory coexisted on a same silicon, first, second and third memories 251-253 are made of either STT-RAM or OST-RAM cells based on SLC or MLC technology.

For OTP memory (i.e., first memory 232 in FIG. 2B or third memory 253 in FIG. 2C), the diameter of planar circular area of an MTJ element has a range of 20-150 nm for either SLC or MLC technology.

Figure 3A:
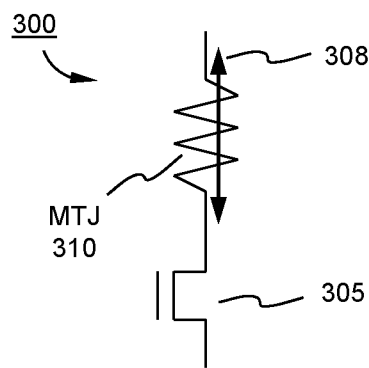
FIGS. 3A-3D are diagrams showing various features of an example single-level cell (SLC) STT-RAM being used for forming a memory subsystem, according to an embodiment of the invention.

FIG. 3A is a schematic diagram showing components of an example SLC STT-RAM cell 300. Each SLC STT-RAM cell 300 contains one transistor 305 and one MTJ (Magnetic Tunnel Junction) element 310 located between source line, bit line and word line. A spin-polarized electric current 308 (shown as an arrow) is used for controlling (i.e., reading and writing) the state of MTJ element 310. In one embodiment, MTJ element operates in a Current Perpendicular to Plane configuration. This also referred to as perpendicular MTJ (PMTJ) element.

Figure 3B:
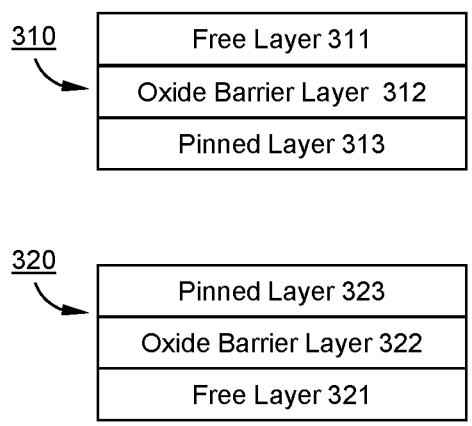

FIG. 3B shows a first example MTJ element 310 that contains two ferromagnetic layers 311 and 313 located on either side of an oxide barrier layer 312. The first ferromagnetic layer's magnetization direction is switchable by the spin-polarized electric current, while the second ferromagnetic layer's magnetization direction is fixed and can provide the spin-polarized electric current for switching. Therefore, the first ferromagnetic layer is referred to as a free layer 311 and the second ferromagnetic layer is referred to as a pinned or fixed magnetic layer 313. The relative direction of magnetization of free layer 311 and pinned layer 313 gives two different states (i.e., zero and one) of the first example MTJ element 310.

In an alternative embodiment, the three layers of a second example MTJ element 320 is reversely arranged from the first example MTJ element 310. In the second example MTJ element 320, the top layer is pinned layer 323 and the bottom layer is free layer 321. The oxide barrier layer 322 is located in between.

Figure 3C:
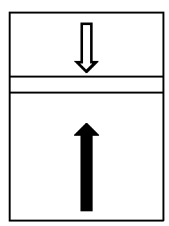
Figure 3D:
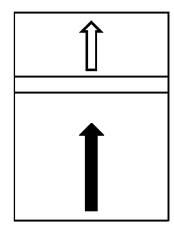

FIG. 3C shows an MTJ element in an SLC STT-RAM having different magnetization directions (i.e., arrows having different directions) in free layer 311 and in pinned layer 313, while FIG. 3D shows two layers having the same magnetization directions. In one embodiment, state "1" and state "0" are assigned to respective configurations in FIG. 3C and FIG. 3D. SLC STT-RAM cell uses a spin-polarized electric current 308 to write only to MTJ element that needs state changes. MTJ element magnetization switching occurs due to a transfer of angular momentum between the spins within the local magnetic moment and electrons passing through the MTJ element 310.

Figure 9A:
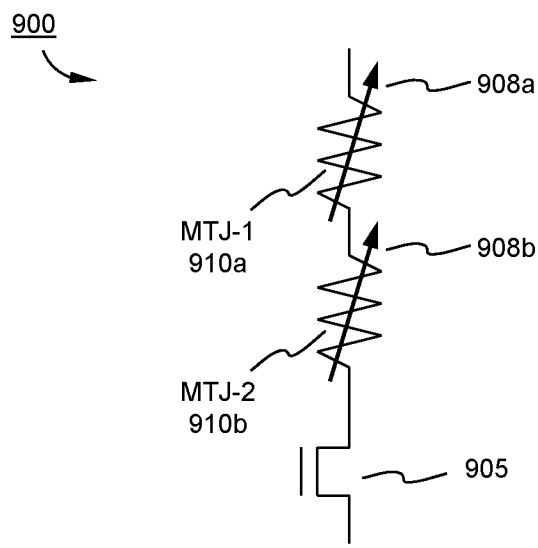
FIGS. 9A-9F are diagrams showing various features of an example MLC STT-RAM being used for forming a memory subsystem, according to an embodiment of the invention.
Figure 9B:
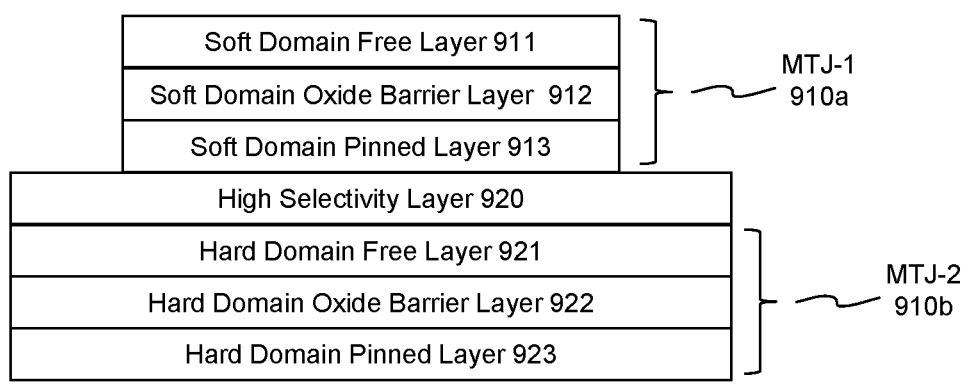
Figure 9C:
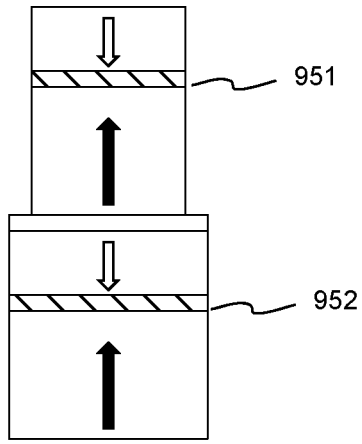
Figure 9D:
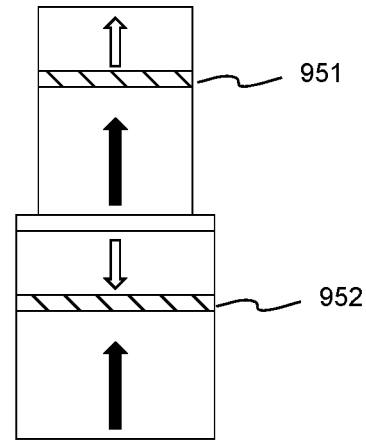
Figure 9E:
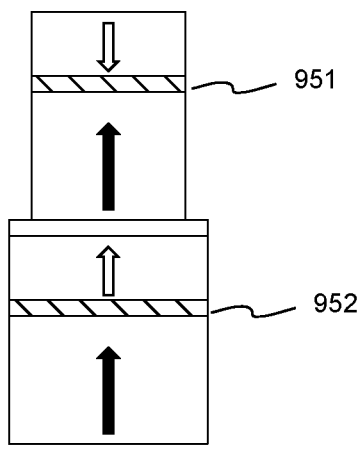
Figure 9F:
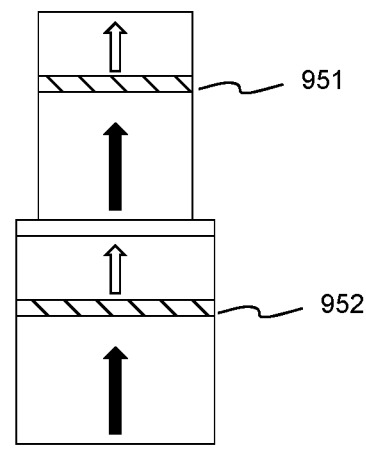

Referring now to MLC technology, FIG. 9A is a schematic diagram showing components of an example MLC STT-RAM cell 900. Each MLC STT-RAM cell 900 contains one transistor 905 and a vertically orientated stack of two MTJ elements (i.e., MTJ-1 910a and MTJ-2 910b) located between source line, bit line and word line (not shown). Respective spin-polarized electric currents 908a-908b (shown as an arrow) are used for controlling (i.e., reading and writing) the state of MTJ-1 910a and MTJ-2 910b. FIG. 9B depicts the structure of an example stack of upper and lower MTJ elements. The vertically orientated stack contains MTJ-1 910a and MTJ-2 910b separated by a high selectivity layer (HSL) 920. Upper MTJ element (MTJ-1 910a) contains a soft domain free layer 911, a soft domain oxide barrier layer 912 and a soft domain pinned layer 913, while lower MTJ element (MTJ-2 910b) contains a hard domain free layer 921, a hard domain oxide barrier layer 922 and a hard domain pinned layer 923. The example upper and lower MTJ elements of MLC STT-RAM allow four distinct states "11", "10", "01" and "00" shown in FIGS. 9C-9F, respectively. Two bits are represented by hard domain and soft domain, respectively. Soft domain MTJ element (i.e., upper MTJ element MTJ-1 910a) has a smaller size comparing to hard domain MTJ element (i.e., lower MTJ element MTJ-2 910b).

Whereas the example shown in FIGS. 9A-9F is for a vertically orientated stack of two MTJ elements, more than two MTJ elements may be in a stack to provide additional states (e.g., three MTJ elements for 8 states).

FIG. 3E is a diagram showing an example MTJ element 330 of an SLC OST-MRAM. The SLC OST-MRAM MTJ element 330 contains five layers: perpendicularly magnetized polarizer layer 331, nonmagnetic metal layer 332 (e.g., copper coupling layer), free layer 333, oxide barrier layer 334 and reference layer 335 (e.g., SAF (synthetic antiferromagnetic) layer). Two different states (i.e., anti-parallel shown in FIG. 3F and parallel shown in FIG. 3G) represent "1" and "0". Magnetization direction in polarizer layer 331 is perpendicular to the horizontal plane of the MTJ element 330, while respective magnetization directions in free layer 333 and in reference layer 335 are parallel to the horizontal plane. Instead of having a circular shape for the STT-RAM MTJ element 310, the OST-MRAM MTJ element 330 has a different shape (e.g., elliptical shape 471 shown in FIG. 4C).

Figure 10B:
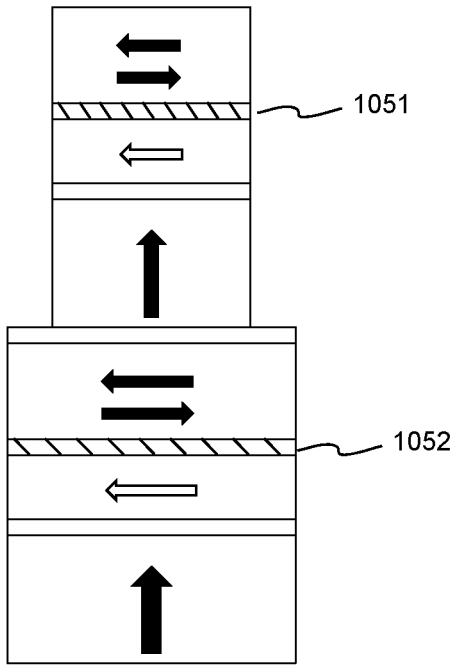
Figure 10C:
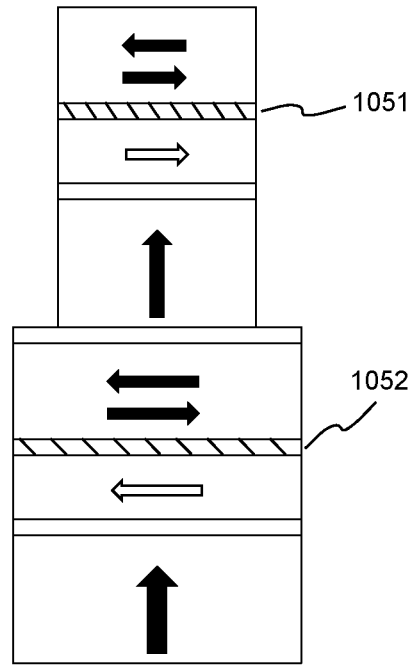
Figure 10D:
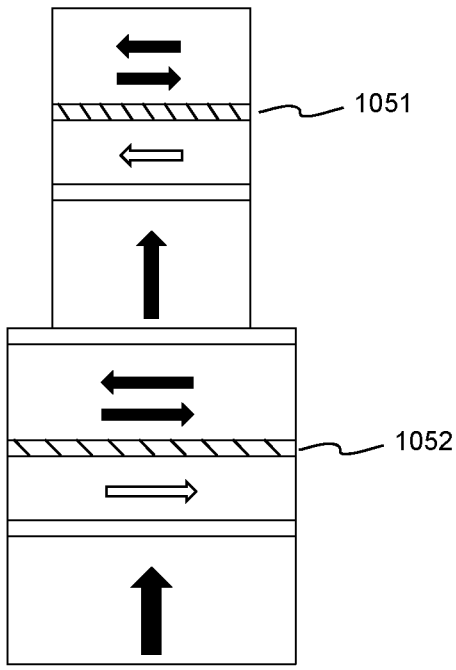
Figure 10E:
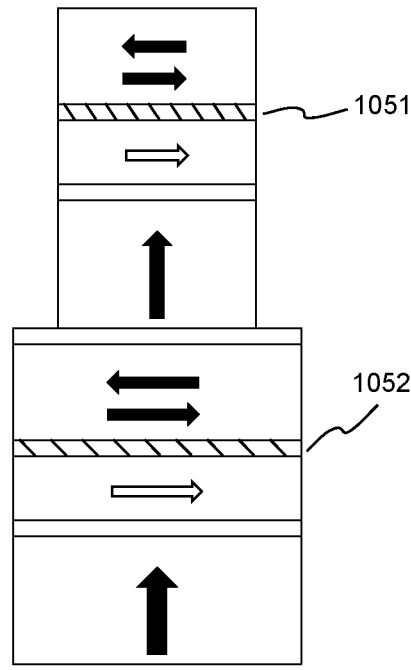

The structure 1000 of an example stack of upper and lower MTJ elements of an MLC OST-MRAM is illustrated in FIG. 10A. Upper and lower MTJ elements are separated by high selectivity layer 1010. The upper MTJ element contains a soft domain reference (SAF) layer 1015, a soft domain oxide barrier layer 1014, a soft domain free layer 1013, a soft domain nonmagnetic metal layer 1012 and a soft domain perpendicularly magnetized polarizer layer 1011. The lower MTJ element contains a hard domain reference (SAF) layer 1005, a hard domain oxide barrier layer 1004, a hard domain free layer 1003, a hard domain nonmagnetic metal layer 1002 and a hard domain perpendicularly magnetized polarizer layer 1001. FIGS. 10B-10E illustrates four distinct states "11", "10", "01" and "00" of the upper and lower MTJ elements of an example MLC OST-MRAM.

Other types of memory technology having substantially similar characteristics of STT-RAM or OST-MRAM cell may be used for forming memory cells in a memory subsystem for a CNN based digital IC for artificial intelligence.

Figure 3H:
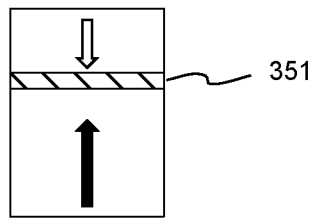
FIGS. 3H-3K are diagrams showing various example MTJ elements with a broken-down oxide barrier layer in SLC technology, according to an embodiment of the invention.
Figure 3I:
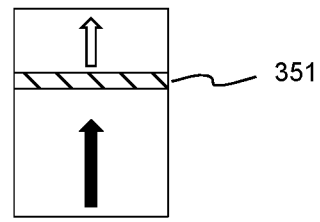
Figure 3J:
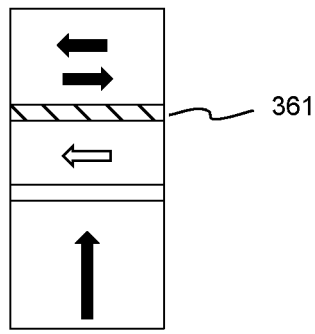
Figure 3K:
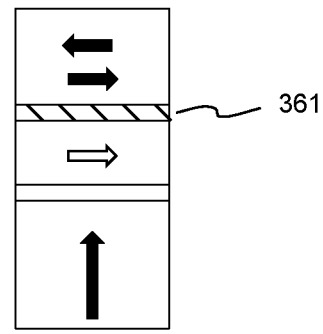

In order to create OTP memory, one method is to break down the oxide barrier layer of MTJ element in either STT-RAM or OST-MRAM cell in SLC or MLC technology. FIGS. 3H-3I show SLC STT-RAM MTJ element with a broken-down oxide barrier layer 351 for anti-parallel and parallel configurations. FIGS. 3J and 3K show anti-parallel and parallel configurations of respective MTJ elements of an example SLC OST-MRAM having corresponding oxide barrier layer 361 broken down. For MLC STT-RAM, FIGS. 9C-9F show broken-down oxide barrier layers 951-952 for respective MTJ elements. FIGS. 10B-10E show broken-down oxide barrier layers 1051-1052 for respective MTJ elements for MLC OST-MRAM.

OTP is referred to data being written to memory only one time (e.g., substantially permanent once written). For either STT-RAM cell or OST-MRAM cell in either SLC or MLC technology, OTP can be performed in many stages: wafer level, chip level, after soldering during fabrication of a CNN based digital IC. For example, a specific application such as face recognition requires a particular set of filter coefficients, which can be permanently written to an IC (i.e., first memory 232 in FIG. 2B) during fabrication. Or a specific usage (e.g., security for certain application or user), the data is permanently written to an IC (i.e., third memory 253 in FIG. 2C).

OTP can also be performed after fabrication during use, for example, a specific pattern unique to any application and any user is created and programmed (i.e., written) to the OTP memory in an initialization procedure or at first use. In one embodiment, one user can write a particular set of filter coefficients to an IC (i.e., first memory 232 in FIG. 2B) for one type of applications, while another user can write a different set of filter coefficients for another type of applications. In another embodiment, a unique pattern of data (e.g., user data such as user identification, name, number, fingerprint, etc.) can be written to an IC (i.e., third memory 253 in FIG. 2C) during use for security or other purposes.

To break down the oxide barrier layer of a MTJ element in SLC technology or respective oxide barrier layers of MTJ elements in MLC technology for creating OTP memory, a number of techniques are used:

(a) applying an electric voltage higher than normal read/write voltage (a range of 100-700 mV (millivolts) in SLC technology and 0.1-1.5 V (volts) in MLC technology) during fabrication or use;
(b) applying an electric current longer than normal read/write time or duty cycle of 5 ns (nanoseconds) during fabrication or use;
(c) setting different size of MTJ elements (bits) in a range of 20-150 nm in diameter during fabrication, the smaller size of MTJ element is easier for respective oxide barrier layers to be broken down; and
(d) setting different cell size such that different gate length of transistors are used during fabrication, a larger transistor would provide larger electric current. The preferred gate length of a transistor is between 50 nm to 280 nm for 28 nm semiconductor technology.

Furthermore, the aforementioned techniques can be used alone or in any combinations, for example, (a) and (c), (a) and (d), (c) and (d), (b), (c) and (d), and the likes.

Applying larger electric voltage can be achieved by a larger transistor 305 of FIG. 3A or a larger transistor 905 of FIG. 9A. Applying longer electric current 308 through an MTJ element 310 in SLC technology, or applying longer duration of electric current 908a-908b through respective MTJ elements (e.g., MTJ-1 910a and MTJ-2 910b) in MLC technology. An example of different sizes of MTJ elements is shown in FIG. 4A, while different cell size (i.e. different pitch) is shown in FIG. 4B.

Figure 4A:
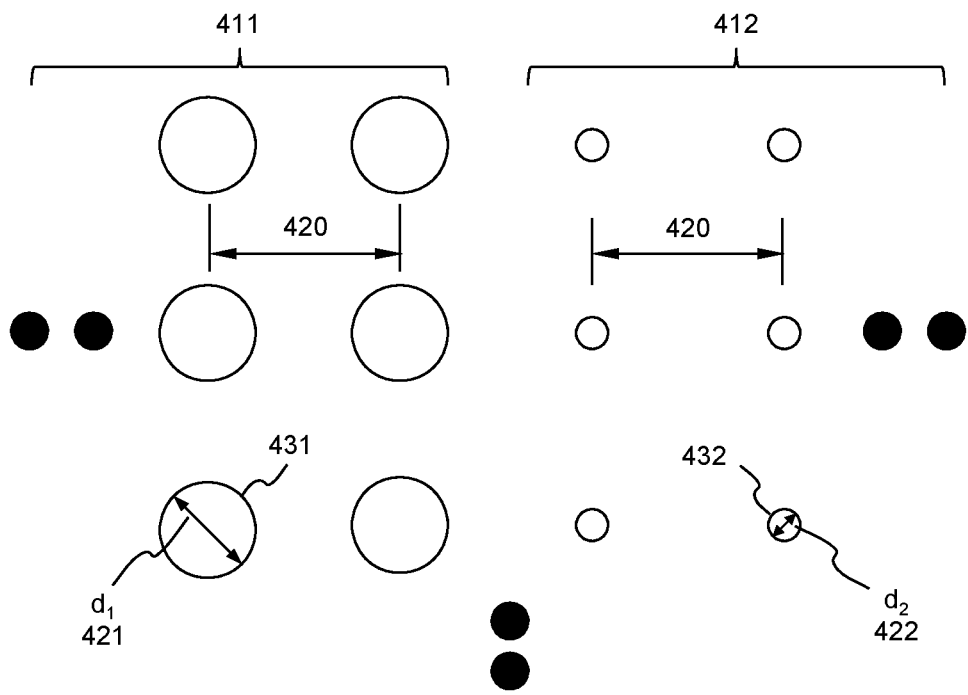
FIG. 4A is a plan view showing example first memory cells and example second memory cells with a same pitch, according to an embodiment of the invention.
Figure 4B:
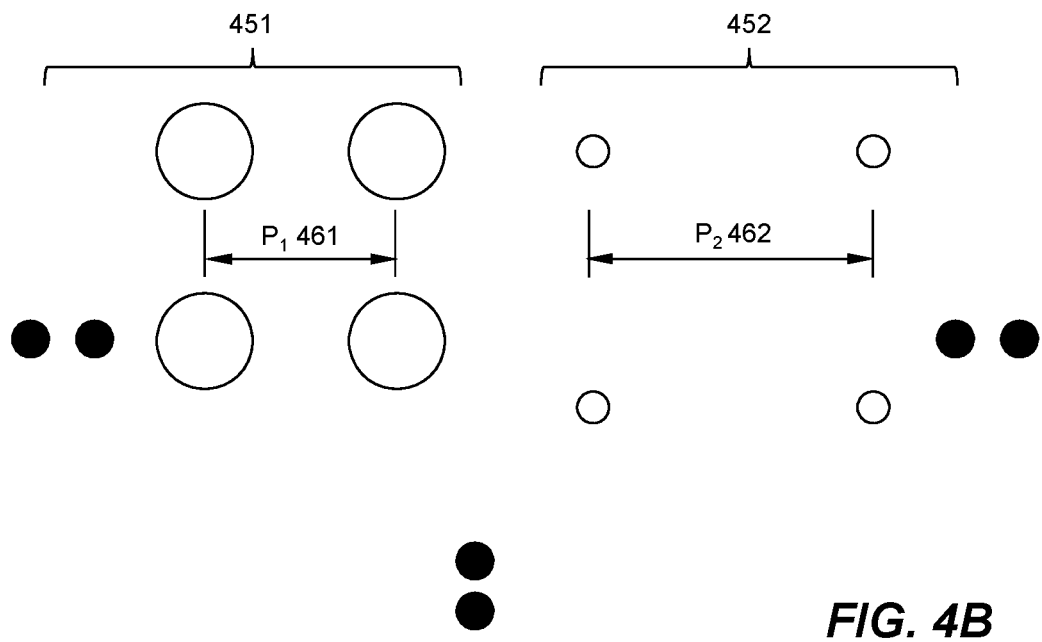
FIG. 4B is a plan view showing a portion of example first memory cells and example second memory cells with different pitches, according to an embodiment of the invention.

FIG. 4A is a plan view showing an example array of first group of STT-RAM cells 411 and an example array of second group of STT-RAM cells 412 with the same constant pitch 420. Pitch is the distance between two identical features on a semi-conductor substrate. Each of the first group of STT-RAM cells 411 contains a magnetic tunnel junction (MTJ) element 431, which has a circular planar area with a diameter (i.e., $d_1$ 421). Each of the second group of STT-RAM cells 412 contains a MTJ element 432, whose circular planar area has a diameter (i.e., $d_2$ 422). Generally the first diameter $d_1$ 421 is larger than the second diameter $d_2$ 422. Larger planar area of an MTJ element allows data be retained longer (e.g., 6 months or more). Smaller area of an MTJ element allows faster and balanced read/write with lower energy (e.g., less electric current).

In another embodiment, the pitch of the first group of STT-RAM cells is different from the pitch of the second group of STT-RAM cells. FIG. 4B is a plan view showing an example array of first group of STT-RAM cells 451 and an example array of second group of STT-RAM cells 452 with different pitches. The array of the first group of STT-RAM cells 451 has a pitch $P_1$ 461 while the array of the second group of STT-RAM cells 452 has a pitch $P_2$ 462. In this example shown in FIG. 4B, the second pitch $P_2$ 462 is greater than the first pitch $P_1$ 461. One of the reasons for larger pitch is to house a larger capacity transistor for providing higher electric current for controlling an MTJ element. Embodiments shown in FIGS. 4A-4B are for the first memory 212 or 251 for storing weights and for the second memory 214, 234 or 252 for storing input signals.

Figure 4C:
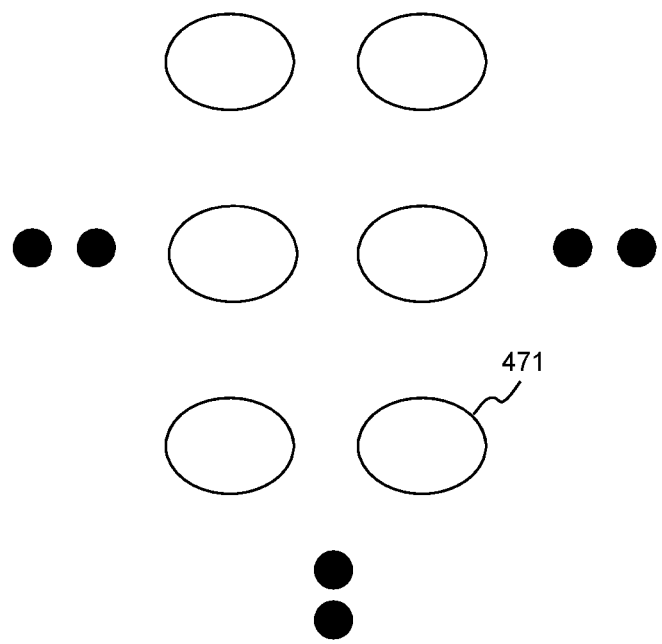
FIG. 4C is a plan view showing respective MTJ elements of an example array of OST-MRAM cells in SLC or MLC technology, according to an embodiment of the invention.

FIG. 4C shows an elliptical shape 471 of respective MTJ elements of an array of OST-MRAM cells. All example MTJ elements shown in FIGS. 4A-4C can be either in SLC or MLC technology.

Figure 5A:
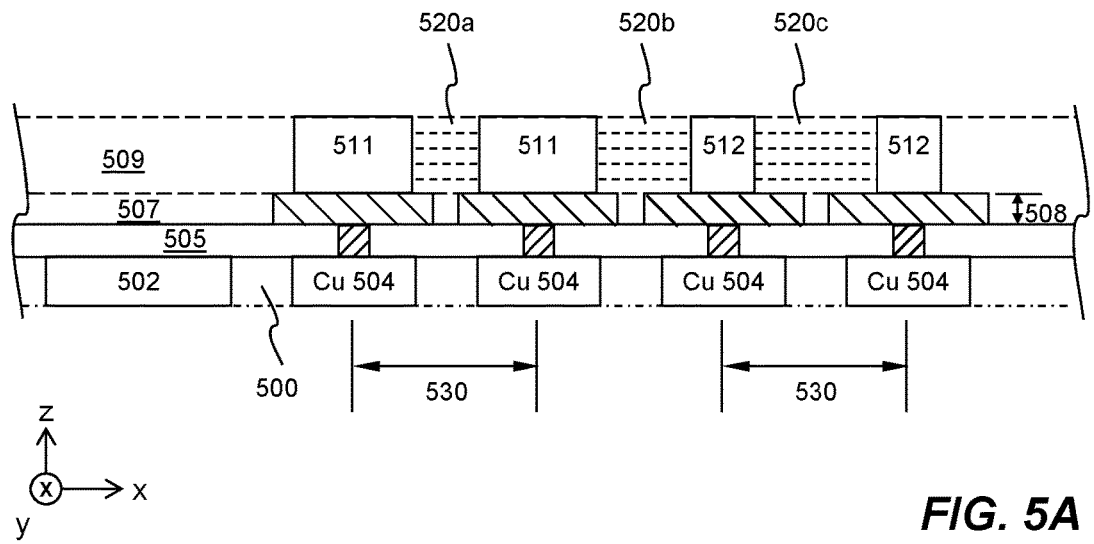
FIG. 5A is an elevation view showing relevant layers during fabrication of an array of example MTJ elements having constant pitch in SLC technology, according to an embodiment of the invention.
Figure 5B:
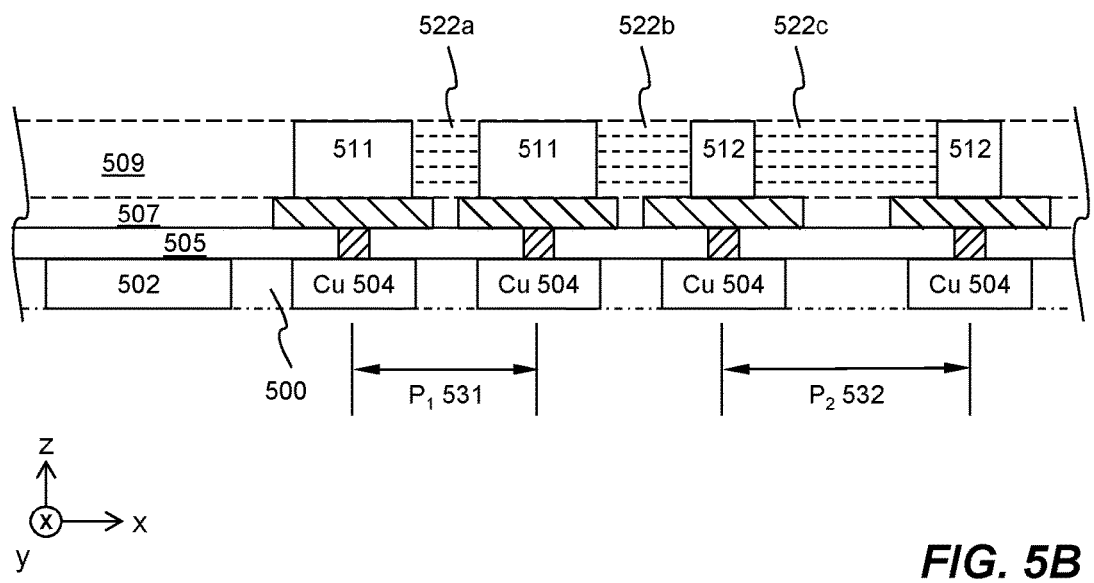
FIG. 5B is an elevation view showing relevant layers during fabrication of an array of example MTJ elements having different pitch in SLC technology, according to an embodiment of the invention.

The Cartesian coordinate system (x-y-z) in FIGS. 5A-5B shows that the vertical or "z" direction for thickness of each layer, while the "x-y" plane is the horizontal plane for each layer to be formed.

FIG. 5A is elevation view of first example layers of during fabrication of MTJ elements of SLC STT-RAM or SLC OST-MRAM cells having a constant pitch 530. A metal layer or substrate 500 contains a number of copper landing pads 504 and metal lines for CNN logic circuits 502. Copper landing pads 504 correspond to transistors (not shown) for each of the first and the second groups of SLC STT-RAM or SLC OST-MRAM cells. Forming on top of the metal layer 500 is a via layer 505. A high selectivity layer (HSL) 507 is formed on top of the via layer 505. HSL 507 has a thickness 508 in a range of 300-4000 Angstrom. Formed on top of the HSL 507 is an array of first group of MTJ elements 511 and an array of second group of MTJ elements 512. Only a few MTJ elements are shown for illustration simplicity and clarity. Unmasked portions 520a-520c are etched out thereafter.

Shown in FIG. 5B, another example layers showing SLC STT-RAM or SLC OST-MRAM cells having different pitches ($P_1$ 531 is smaller than $P_2$ 532). Having different pitch in the MTJ elements (i.e., first group of MTJ elements 511 and second group of MTJ elements 512), the unmasked portions 522a-522c are different. Larger pitch (e.g., $P_2$ 532) allows a larger transistor for providing higher current.

As a result, etching process of the unmasked portions 522a-522c require another layer (i.e., HSL 507 in form of high selectivity circular pads 620-622 for STT-RAM, or elliptical pads for OST-MRAM (not shown)) as an etching support such that the etching is performed simultaneously for a smaller unmasked portion 522a and for a larger unmasked portion 522c to form MTJ elements 511-512 in the same time.

Figure 5C:
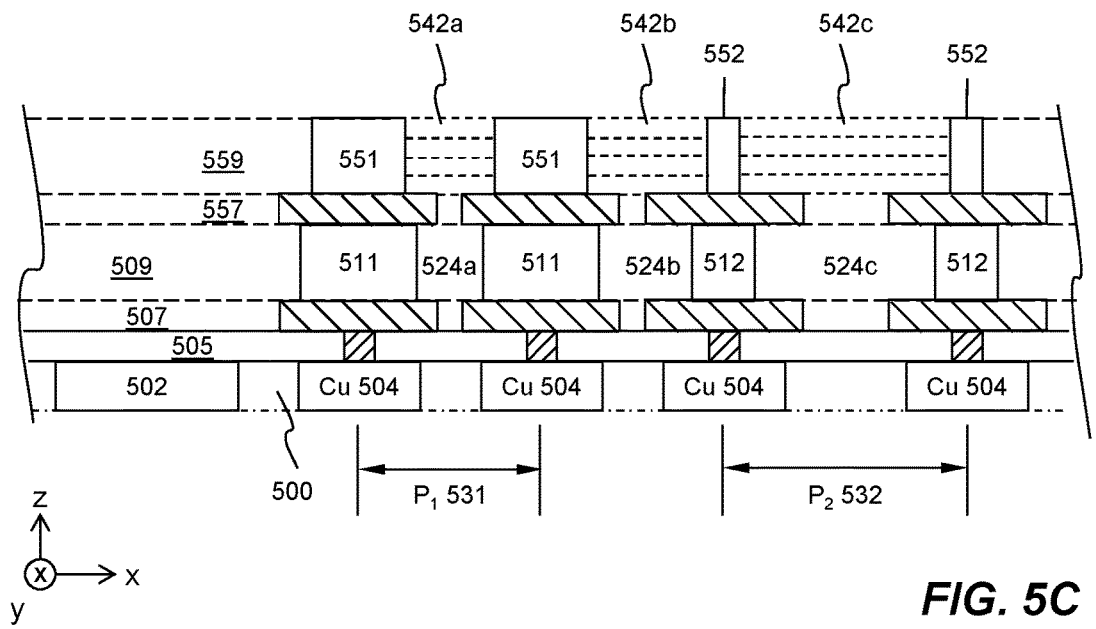
FIGS. 5C-5D are respective elevation views showing relevant layers during fabrication of two different examples of array of MTJ elements in MLC technology, according to an embodiment of the invention.

FIG. 5C shows an elevation view showing relevant layers during fabrication of an array of first example MTJ elements (i.e., lower MTJ elements 511-512 and upper MTJ elements 551-552) in MLC technology. FIG. 5C is extended from FIG. 5B, metal layer 500, via layer 505, and a first HSL 507 and a first MTJ element layer 509 for lower MTJ elements 511-512 are the same. On top of the lower MTJ elements 511-512 is a second HSL 557 and a second MTJ element layer 559. The second HSL 557 provides the substantially similar support function for etching process of the unmasked portions 542a-542c to form upper MTJ elements 551-552. The second HSL 557 is larger than the largest of the upper MTJ elements 551-552.

Figure 6A:
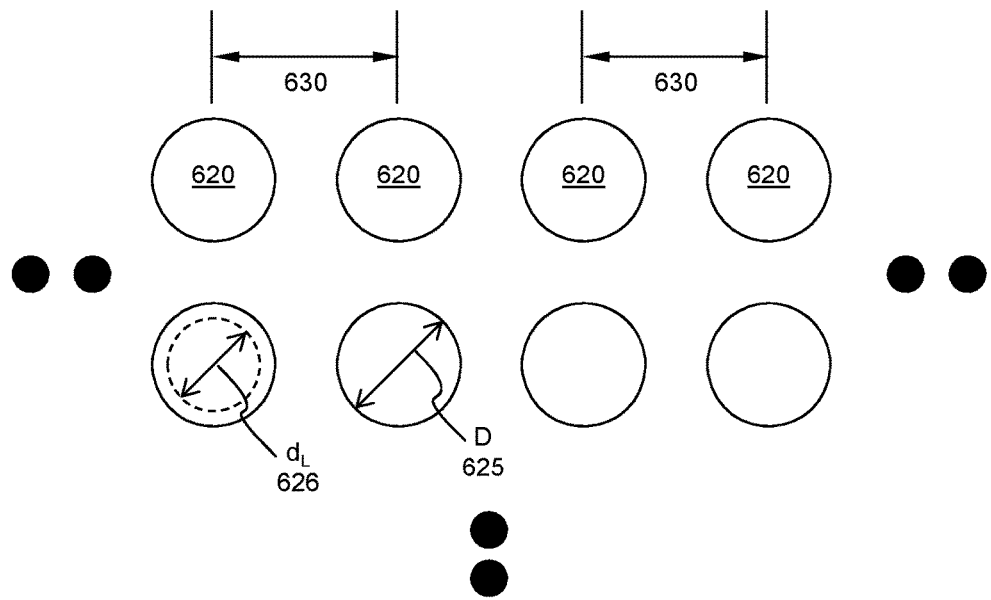
FIGS. 6A-6D are simplified schematic plan views showing respective high selectivity layers of FIGS. 5A-5D.
Figure 6B:
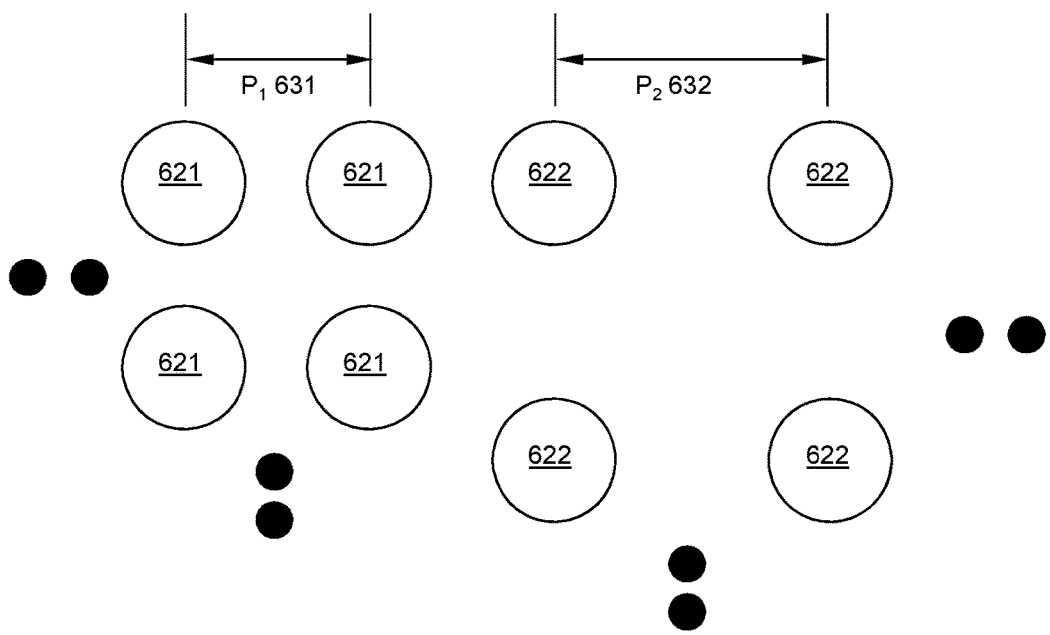
Figure 6C:
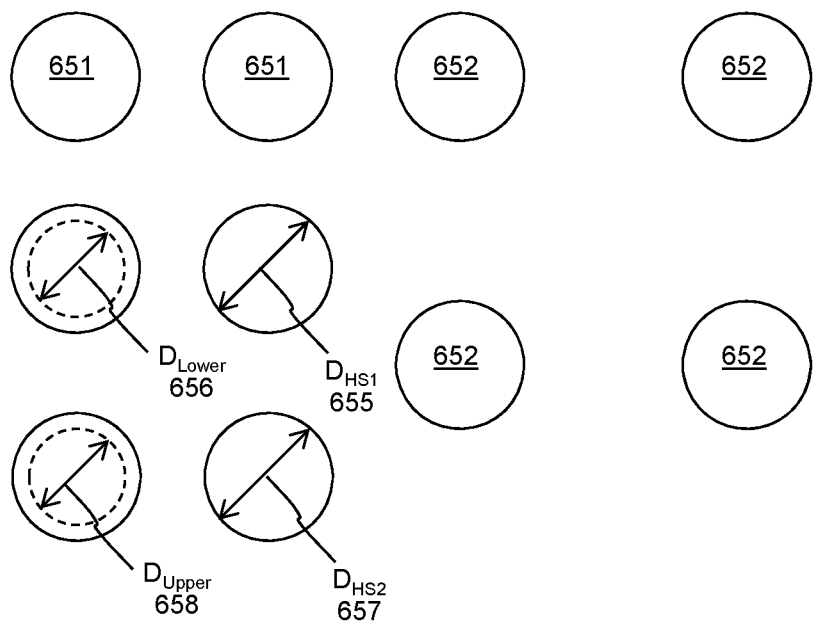

An array of circular HS pads 651 of the first group of magnetic random access memory cells and an array of circular HS pads 652 of the second group of magnetic random access memory cells are shown in FIG. 6C, which is a simplified schematic plan view of respective HS layers in FIG. 5C.

Each of the circular HS pads 651 in the first HSL 507 has a diameter $D_{HS1}$ 655. Each of the first group of lower MTJ elements 511 has a diameter $D_{LOWER}$ 656. Each of the circular HS pads in the second HSL 557 has a diameter $D_{HS2}$ 657. Each of the first group of upper MTJ elements 551 has a diameter $D_{UPPER}$ 658. The example shown in FIG. 6C is for MLC STT-RAM.

Figure 5D:
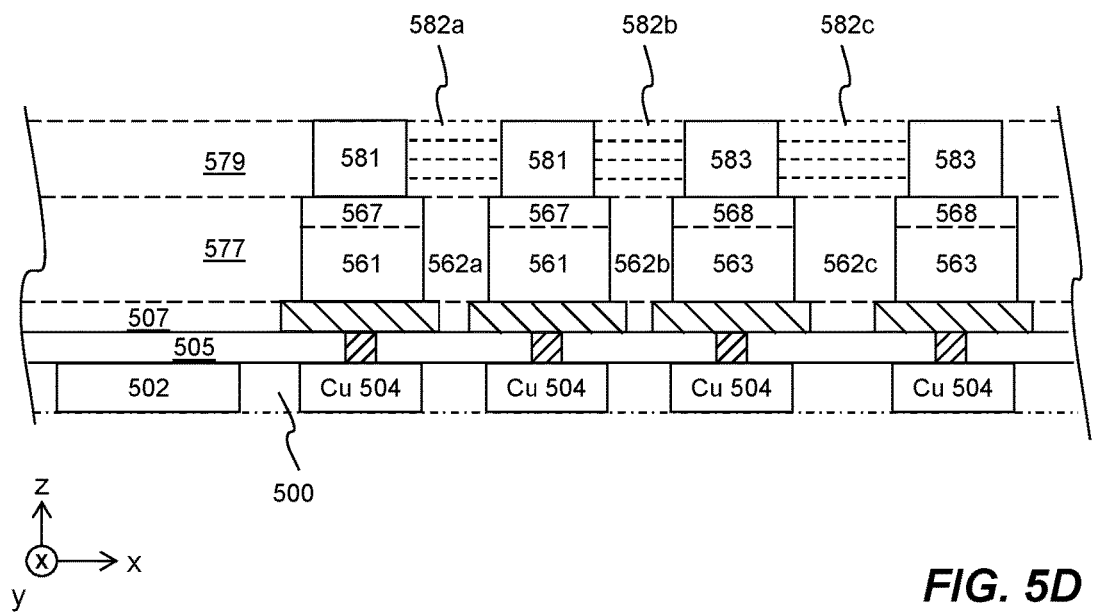

In another embodiment, FIG. 5D shows relevant layers during fabrication of an array of second example MTJ elements (i.e., lower MTJ elements 561, 563 and upper MTJ elements 581, 583) in MLC technology. A metal layer 500 contains a number of copper landing pads 504 and metal lines for CNN logic circuits 502. A via layer 505 is formed on top of the metal layer 500.

A first HSL 507 is formed on the via layer 505. A first MTJ element layer 577 is then formed on the first HSL 507. The first MTJ element layer 577 combines a second HSL (shown as HS pads 567-568) on top of two groups of corresponding lower MTJ elements 561, 563. Unmasked portions 562a-562c are etched out to form lower MTJ elements 561, 563

Formed on top of the first MTJ layer 577 is the second MTJ element layer 579, which contains a first group of upper MTJ elements 581 and a second group of upper MTJ elements 583. Unmasked portions 582a-582c are etched out to form upper MTJ elements 581, 583.

Figure 6D:
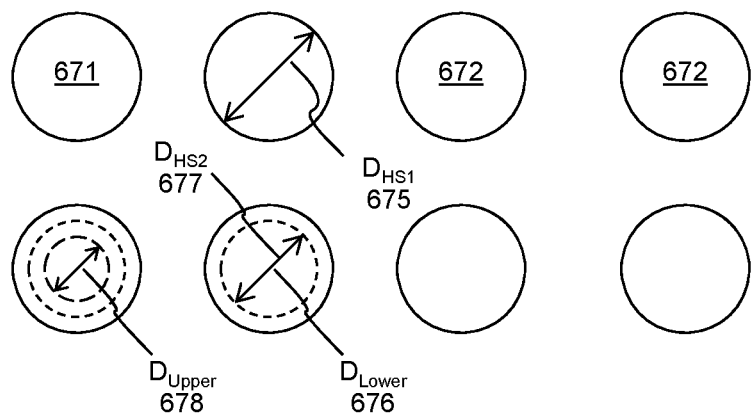

An array of circular HS pads 671-672 is shown in FIG. 6D, which is a simplified schematic plan view of respective HS layers in FIG. 5D. The diameter of each circular HS pads 671 is the first HSL 507 is $D_{HS1}$ 675. The diameter of each lower MTJ element is $D_{LOWER}$ 676 and the diameter of each upper MTJ element is $D_{UPPER}$ 678. $D_{LOWER}$ 676 is larger than $D_{UPPER}$ 678 by a margin in a range of 20-60 nm. Since the second HSL is combined onto the first MTJ element layer, $D_{HS2}$ 677 is equal to $D_{LOWER}$ 676.

Figure 7A:
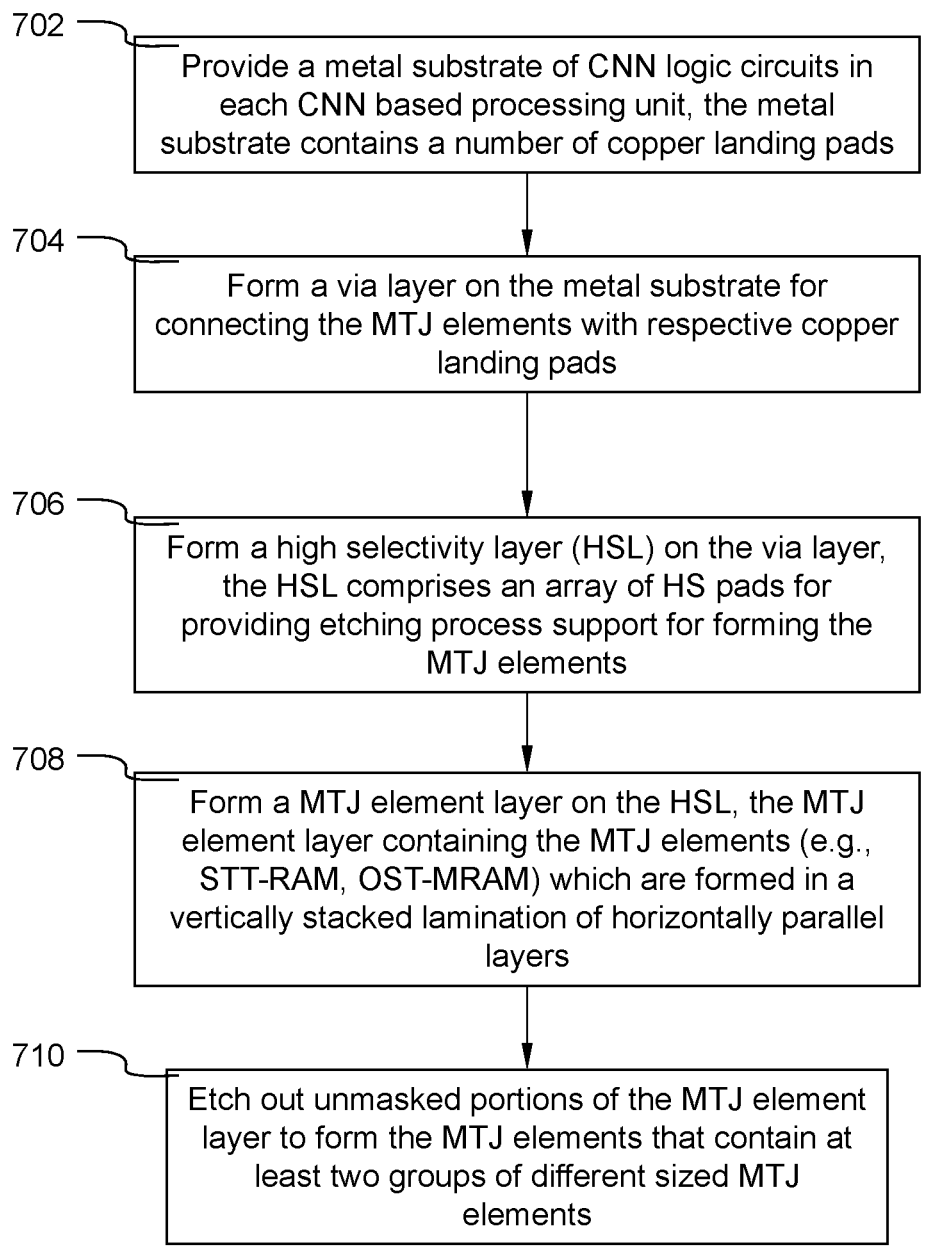
FIG. 7A is a flowchart illustrating an example process of fabricating SLC MTJ elements of an embedded memory subsystem in a CNN based IC for artificial intelligence, according to an embodiment of the invention.

FIG. 7A is a flowchart illustration an example process 700 of fabricating example SLC magnetic tunnel junction (MTJ) elements of an embedded memory subsystem in a digital integrated circuit containing a plurality of CNN based processing units. Process 700 is understood with previous figures especially FIGS. 5A-5B.

Process 700 starts at step 702 by providing a metal substrate (e.g., metal layer 500 of FIGS. 5A-5D) in each CNN based processing unit and for all transistors of the arrays of magnetic random access memory cells. Next step 704, a via layer 505 is formed on the metal substrate for connecting MTJ elements with respective copper landing pads 504 located on the metal substrate. The MTJ elements may contain more than one group of different sized MTJ elements. In the example shown in FIG. 2A and FIG. 2B, there are two groups: first and second memories. FIG. 4A shows each of the first group of the MTJ elements 511 has a first circular planar area 431 and each of the second group of the MTJ elements 512 has a second circular planar area 432. The example in FIG. 2C contains three groups: first, second and third memories, each group can contain different sized MTJ elements not shown).

Next, at step 706, a high selectivity layer (HSL) 507 is formed on the via layer 505. HSL 507 contains an array of high selectivity pads for providing etching process support for forming the MTJ elements 511-512. In one embodiment, FIG. 6A shows a first example HSL containing an array of high selectivity circular pads 620 with constant or same pitch 630. In the second example HSL shown in FIG. 6B, there are two arrays of high selectivity circular pads 621-622. The first array has pitch $P_1$ 631 while the second array has pitch $P_2$ 632. Each high selectivity circular pad 620-622 has the area with a diameter D 625 equaling to a margin (in a range of 20-60 nm) plus the larger of the two types of MTJ elements (i.e., $d_L$ 626 is the larger of $d_1$ 421 and $d_2$ 422 of FIG. 4A). The above examples shown in FIGS. 4A-4B and 6A-6B are for SLC SST-RAM. For SLC OST-MRAM, elliptical pads may be used instead of circular pads. The most important aspect is that HS pads to provide a margin (20-60 nm) larger than the MTJ elements to be formed.

Then, at step 708, a MTJ element layer 509 is formed on the HSL 507. The MTJ element layer 509 contains the MTJ elements 511-512 in a vertically stacked lamination of horizontally parallel layers. In STT-RAM, MTJ element 310 or 320 contains three vertically stacked layers shown in FIG. 3B. In OST-MRAM, MTJ element 330 contains five vertically stacked layers shown in FIG. 3E.

At step 710, unmasked portions 520a-520c or 522-522c of the MTJ element layer 509 are etched out to form the MTJ elements that contain at least two groups of different sized MTJ elements (e.g., first group of MTJ elements 511 and second group of MTJ elements 512). The etching can be done with a number of techniques, for example, using a plasma process based on argon ions or other argon rich gases.

Figure 7B:
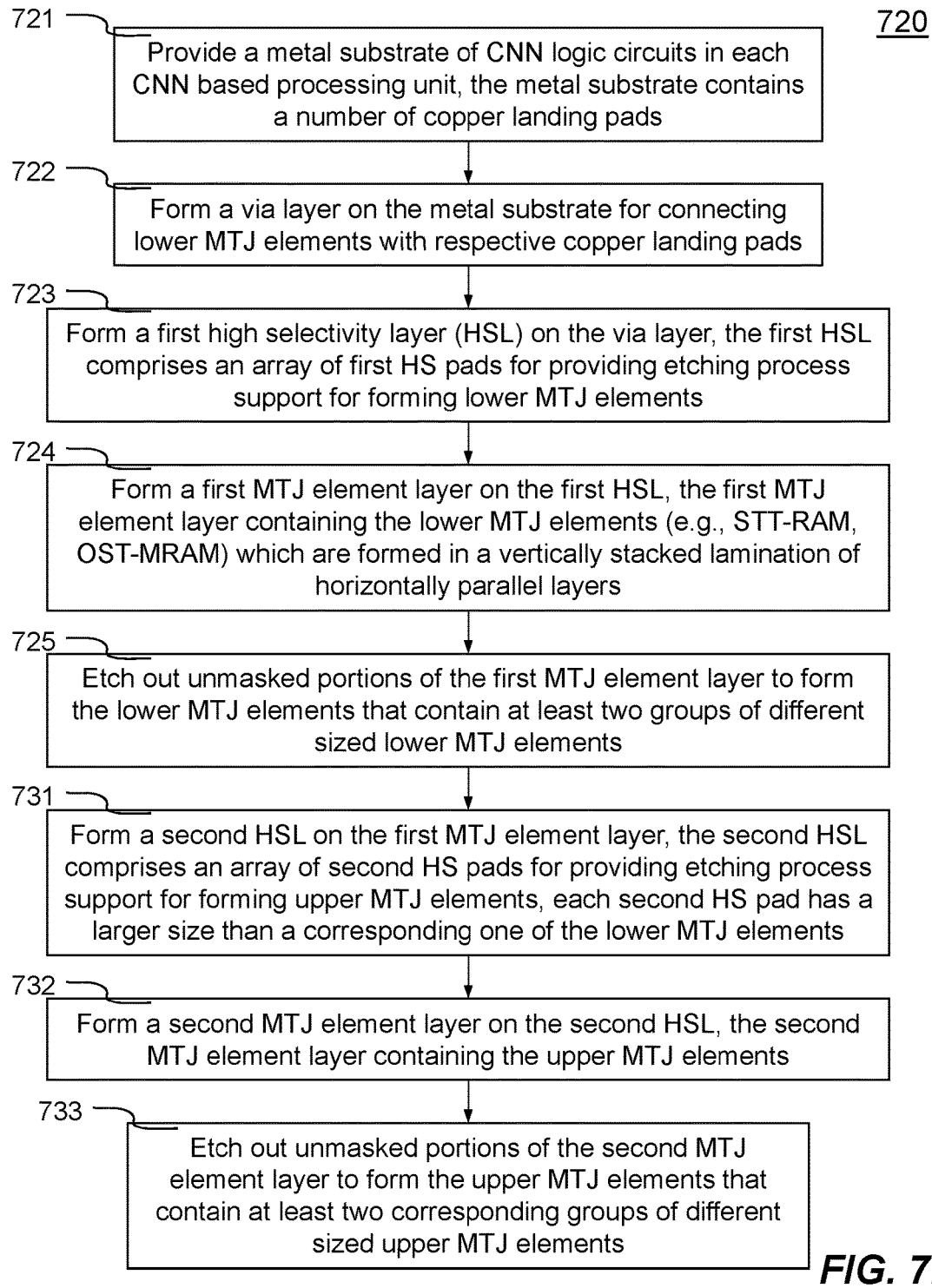
FIG. 7B is a flowchart illustrating an example process of fabricating first example MLC MTJ elements of an embedded memory subsystem in a CNN based IC for artificial intelligence, according to an embodiment of the invention.

Referring now to FIG. 7B, it is shown an example process 720 of fabricating a first example MLC MTJ elements of an embedded memory subsystem in a CNN based IC for artificial intelligence. Process 720 is understood with previous figures especially FIG. 5C.

Process 720 starts at step 721 by providing a metal substrate 500 substantially similar to step 702 of process 721. Next at step 722, a via layer 505 is formed on the metal substrate 500 for connecting lower MTJ elements (e.g., lower MTJ elements 511-512 of FIG. 5C) with respective copper landing pads 504. Then at step 723, a first HSL 507 is formed on the via layer 505. The first HSL 507 contains an array of first HS pads (e.g., circular pads 651-652 of FIG. 6C for STT-RAM) for providing etching process support for forming lower MTJ elements 511-512.

The first MTJ element layer 509 is then formed on the HSL 507 at step 724. At step 725, unmasked portion 524a-524c of the first MTJ element layer 509 are etched out to form the lower MTJ elements that contain at least two groups of different sized lower MTJ elements (e.g., first group of lower MTJ elements 511 and second group of lower MTJ elements 512). The lower MTJ elements can be either STT-RAM or OST-MRAM.

Next, at step 731, a second HSL 557 is formed on the first MTJ element layer 509. The second HSL 557 comprises an array of second HS pads for providing etching process support for forming upper MTJ elements. Each of the second HS pads has a larger size than a corresponding one of the lower MTJ elements. For example shown in FIG. 6C, $D_{HS2}$ 675 is larger than $D_{LOWER}$ 656. Furthermore, to support etching process, $D_{HS1}$ 655 is larger than $D_{LOWER}$ 656 by a margin in a range of 20-60 nm. Similarly, $D_{HS2}$ 657 is larger than $D_{UPPER}$ 658 by the same margin or more. In general, $D_{HS1}$ 655 is equal to $D_{HS2}$ 657. However, they can be different as long as each having enough margin for providing etching process support for forming respective MTJ elements.

The second MTJ element layer 559 is formed on the second HSL 557 at step 732. Finally at step 733, unmasked portions 542a-542c of the second MTJ element layer 559 are etched out to form the upper MTJ elements that contain at least two groups of different sized upper MTJ elements. For example, the first group of upper MTJ elements 551 corresponds to the first group of lower MTJ elements 511, and the second group of upper MTJ elements 552 corresponds to the second group of lower MTJ elements 512.

Figure 7C:
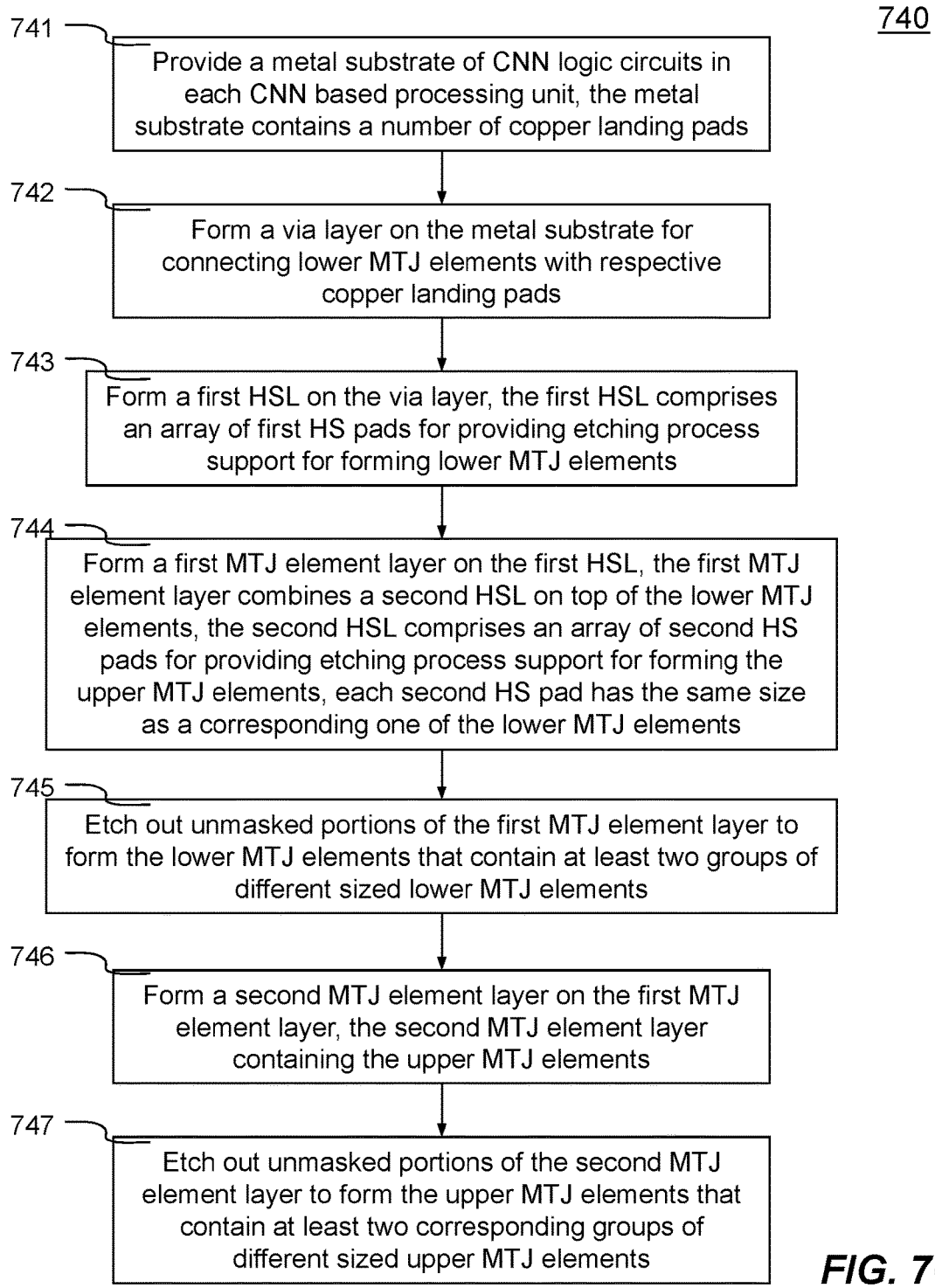
FIG. 7C is a flowchart illustrating an example process of fabricating second example MLC MTJ elements of an embedded memory subsystem in a CNN based IC for artificial intelligence, according to an embodiment of the invention.

FIG. 7C is a flowchart illustrating an example process 740 of fabricating a second MLC MTJ elements of an embedded memory subsystem in a CNN based IC for artificial intelligence. Process 740 is understood with previous figures especially FIG. 5D.

First three steps 741-743 of process 740 are exactly the same as steps 721-723 of process 720. A metal substrate 500 is provided. A via layer 505 is formed on the metal substrate 500. A first HSL 507 is formed on the via layer 505. The first HSL 507 contains an array of first HS pads (e.g., circular pads 671-672 of FIG. 6D for STT-RAM) for providing etching process support for forming lower MTJ elements 561, 563.

At step 744, a first MTJ element layer 577 is formed on the first HSL 507. The first MTJ layer 577 combines a second HSL (second HS pads 567-568) on top of lower MTJ elements 561, 563. The second HSL 567 comprises a number of second HS pads 567-568 for providing etching process support for forming the upper MTJ elements 581, 583. Each of the second HS pads 567-568 has the same size as a corresponding one of the lower MTJ elements 561-563. For example shown in FIG. 6D, $D_{HS2}$ 677 is the same as $D_{LOWER}$ 676. Furthermore, to support etching process, $D_{HS1}$ 675 is larger than $D_{LOWER}$ 676 by a margin in a range of 20-60 nm. Similarly, $D_{LOWER}$ 676 is larger than $D_{UPPER}$ 678 by the same margin.

At step 745, unmasked portions 562a-562c of the first MTJ element layer 577 are etched out to form the lower MTJ elements that contains at least two groups of different sized lower MTJ elements (e.g., first group of lower MTJ elements 561 and second group of lower MTJ element 563).

At step 746, a second MTJ element layer 579 is formed on the first MTJ element layer 577. Finally, at step 747, unmasked portions 582a-582c of the second MTJ layer 579 are etched out to form the upper MTJ elements that contain at least two corresponding groups of different sized upper MTJ elements. For example, the first group of upper MTJ elements 581 corresponds to the first group of lower MTJ elements 561, and the second group of upper MTJ elements 583 corresponds to the second group of lower MTJ elements 563.

FIG. 8 is a table 800 summarizing relevant properties of a number of materials that can be used in high selectivity layer during fabrication of the memory subsystem in accordance with one embodiment. During etching operation of the MTJ layers, HSL is added for providing the support. In one embodiment, materials having a sputtering rate less than 90 can be used in the HSL. According to table 800, any one or any combination of Nb, Ta, Ti, TiN, W and Cr would fit the criterion. In other words, HSL can contain two layers of different materials, for example, TiN/Nb, TiN/Ti, TiN/W, TiN/Zr and the likes.

Although the invention has been described with reference to specific embodiments thereof, these embodiments are merely illustrative, and not restrictive of, the invention. Various modifications or changes to the specifically disclosed exemplary embodiments will be suggested to persons skilled in the art. For example, whereas image processing has been shown and described as an example usage of the CNN based digital IC, other applications may be used, for example, voice recognition. Sound waves can be recorded and converted into a series of digital images (e.g., using fast Fourier Transform), whose features in turn can be extracted using a CNN based digital IC. Furthermore, whereas two MTJ elements have been shown and described for the MLC technology, more than two MTJ elements may be used to achieve the same, for example, three MTJ elements for three-bit of data. Additionally, two groups of different sized MTJ elements have been shown and described for the at least two groups, any number of groups of different sized MTJ elements may be used for achieving the same, for example, three groups. Finally, shape of the HS pads has been generally shown and described as circular, other suitable geometric shapes may be used to achieve the same, for example, elliptical shape. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A digital integrated circuit for artificial intelligence comprising:
   a semi-conductor substrate embedded in a single semi-conductor chip, the semi-conductor substrate containing a plurality of cellular neural networks (CNN) processing units, each CNN processing unit comprising:
      CNN logic circuits; and
      an embedded memory subsystem operatively coupling to the CNN logic circuits;
      the embedded memory subsystem further comprising:
         an array of first magnetic random access memory cells configured for storing a set of weights; and
         an array of second magnetic random access memory cells configured for storing the input signals that require higher endurance of balanced data read and write operations than the array of the first magnetic random access memory cells, each of the first and second magnetic random access memory cells containing at least two vertically stacked magnetic tunnel junction (MTJ) elements.

2. The digital integrated circuit of claim 1, further comprises at least one input/output data bus operatively coupling to the plurality of the CNN processing units via the memory subsystem and a controller for controlling operations of the plurality of CNN processing units.

3. The digital integrated circuit of claim 2, wherein said each of the first and second magnetic random access memory cells comprises a multi-level cell spin transfer torque magnetic random access memory (MLC STT-RAM) cell.

4. The digital integrated circuit of claim 2, wherein said each of the first and second magnetic random access memory cells comprises a multi-level cell orthogonal spin transfer magnetic random access memory (MLC OST-MRAM) cell.

5. The digital integrated circuit of claim 2, wherein the semi-conductor substrate comprises a silicon substrate.

6. A digital integrated circuit for artificial intelligence comprising:
   a semi-conductor substrate embedded in a single semi-conductor chip, the semi-conductor substrate containing a plurality of cellular neural networks (CNN) processing units, each CNN processing unit comprising:
      CNN logic circuits; and
      an embedded memory subsystem operatively coupling to the CNN logic circuits; the embedded memory subsystem further comprising:
         an array of first magnetic random access memory cells configured for storing a set of one-time-programming weights; and
         an array of second magnetic random access memory cells configured for storing the input signals that require higher endurance of balanced data read and write operations than the array of the first magnetic random access memory cells, each of the first and second magnetic random access memory cells containing at least two vertically stacked magnetic tunnel junction (MTJ) elements.

7. The digital integrated circuit of claim 6, further comprises at least one input/output data bus operatively coupling to the plurality of the CNN processing units via the memory subsystem and a controller for controlling operations of the plurality of CNN processing units.

8. The digital integrated circuit of claim 7, wherein the semi-conductor substrate comprises a silicon substrate.

9. The digital integrated circuit of claim 7, wherein each MTJ element contains an oxide barrier layer.

10. The digital integrated circuit of claim 9, wherein the set of one-time-programming weights is created by breaking down the oxide barrier layer of the MTJ element by using at least one of following techniques:
   (a) applying an electric voltage larger than a voltage range for normal read/write operations;
   (b) applying a longer duty cycle of electric current than normal read/write time;
   (c) configuring different sizes for the MTJ elements, whereby a smaller size allows easier break-down of the respective oxide barrier layers; and
   (d) setting a different gate length of a transistor, whereby a larger transistor allows larger electric current to break down the respective oxide barrier layers.

11. The digital integrated circuit of claim 9, wherein said each of the first and second magnetic random access memory cells comprises a multi-level cell spin transfer torque magnetic random access memory (MLC STT-RAM) cell.

12. The digital integrated circuit of claim 9, wherein said each of the first and second magnetic random access memory cells comprises a multi-level cell orthogonal spin transfer magnetic random access memory (MLC OST-MRAM) cell.

\* \* \* \* \*